(12) United States Patent
Meotto et al.

(10) Patent No.: US 9,224,873 B2
(45) Date of Patent: Dec. 29, 2015

(54) METHOD OF FABRICATING A CHARGE TRAP NAND FLASH MEMORY DEVICE

(71) Applicant: MICRON TECHNOLOGY, INC., Boise, ID (US)

(72) Inventors: Umberto M. Meotto, Rivoli (IT); Giulio Albini, Boise, ID (US); Paolo Tessariol, Boise, ID (US); Paola Bacciaglia, Ornago (IT); Marcello Mariani, Milan (IT)

(73) Assignee: MICRON TECHNOLOGY, INC., Boise, ID (US)

( * ) Notice: Subject to any disclaimer, the term of this patent is extended or adjusted under 35 U.S.C. 154(b) by 108 days.

(21) Appl. No.: 13/687,726

(22) Filed: Nov. 28, 2012

(65) Prior Publication Data
US 2013/0087849 A1    Apr. 11, 2013

Related U.S. Application Data

(62) Division of application No. 12/346,363, filed on Dec. 30, 2008, now Pat. No. 8,329,545.

(51) Int. Cl.
*H01L 29/792* (2006.01)
*H01L 27/115* (2006.01)
*H01L 29/66* (2006.01)

(52) U.S. Cl.
CPC ........ *H01L 29/792* (2013.01); *H01L 27/11573* (2013.01); *H01L 29/66833* (2013.01)

(58) Field of Classification Search
CPC ............ H01L 27/11573; H01L 29/792; H01L 29/66833; H01L 27/1157; H01L 27/11575
See application file for complete search history.

(56) References Cited

U.S. PATENT DOCUMENTS

| | | | |
|---|---|---|---|
| 6,403,435 B1 * | 6/2002 | Kang et al. | 438/311 |
| 7,498,226 B2 * | 3/2009 | Kim et al. | 438/286 |
| 7,723,777 B2 * | 5/2010 | Power et al. | 257/316 |
| 7,955,960 B2 * | 6/2011 | Kim et al. | 438/496 |
| 2003/0042534 A1 * | 3/2003 | Bhattacharyya | 257/317 |
| 2005/0250307 A1 * | 11/2005 | Park et al. | 438/618 |
| 2006/0118854 A1 * | 6/2006 | Lee | 257/315 |
| 2007/0004152 A1 * | 1/2007 | Kim et al. | 438/286 |
| 2008/0157092 A1 * | 7/2008 | Arai et al. | 257/67 |
| 2010/0038696 A1 * | 2/2010 | Power et al. | 257/316 |
| 2012/0156846 A1 * | 6/2012 | Thees et al. | 438/285 |

* cited by examiner

*Primary Examiner* — Jarrett Stark
(74) *Attorney, Agent, or Firm* — Dicke, Billig & Czaja, PLLC

(57) ABSTRACT

Subject matter disclosed herein relates to a method of manufacturing a semiconductor integrated circuit device, and more particularly to a method of fabricating a charge trap NAND flash memory device.

11 Claims, 6 Drawing Sheets

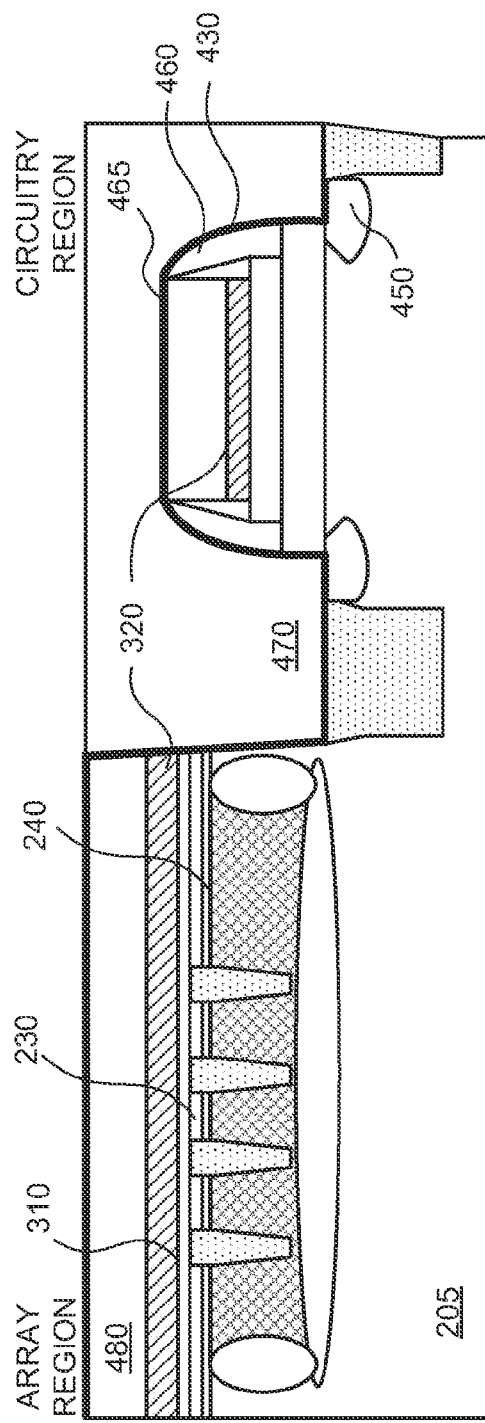

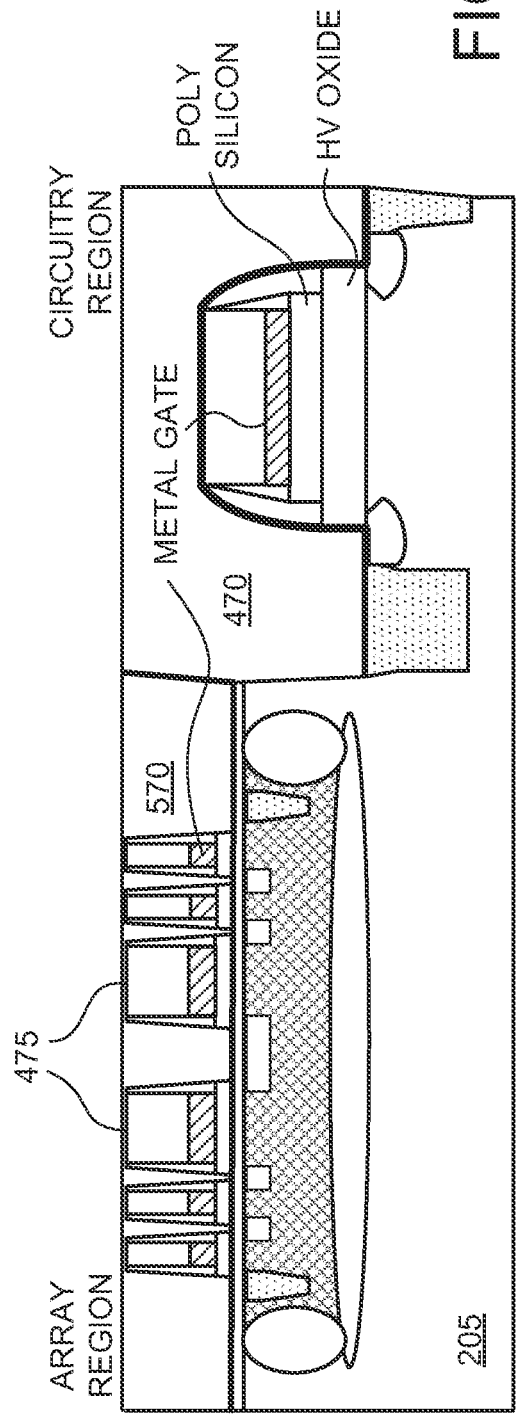

METHOD OF FABRICATING A CHARGE TRAP NAND FLASH MEMORY DEVICE

CROSS-REFERENCE TO RELATED APPLICATIONS

This application is a divisional of U.S. patent application Ser. No. 12/346,363, filed Dec. 30, 2008, the entire disclosure of which is hereby incorporated by reference.

BACKGROUND

1. Field

Subject matter disclosed herein relates to a method of manufacturing a semiconductor integrated circuit device, and more particularly to a method of fabricating a charge trap NAND flash memory device.

2. Information

Floating gate cells are typically integrated with high voltage (HV) and low voltage (LV) transistors in semiconductor devices such as NAND flash memories. A single thin oxidation is typically used to build both LV metal oxide semiconductor substrate (MOS) and LV cell structure. In such a case, an LV oxide and a tunnel oxide may grow on the substrate during the same process step. Such a single process step and a resulting structure, however, may limit scalability and reliability of the resulting structure.

BRIEF DESCRIPTION OF THE DRAWINGS

Non-limiting and non-exhaustive embodiments will be described with reference to the following figures, wherein like reference numerals refer to like parts throughout the various figures unless otherwise specified.

FIG. 4A is a cross-sectional view of a semiconductor structure along a wordline of an array region, according to an embodiment.

FIG. 5 is a cross-sectional view of a semiconductor structure including pre-metal deposition, according to an embodiment.

DETAILED DESCRIPTION

Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments.

In an embodiment, a charge trap NAND flash memory structure may include a metal gate layer that is common to both an array region and a circuitry, or peripheral region. Such a common metal gate layer may be used both for array connections, such as for word and/or bit lines for example, and peripheral circuitry connections. In a particular embodiment, a charge trapping layer may be disposed on a tunnel oxide layer. Such a charge trapping layer may act as a charge storage element during an operation of the NAND semiconductor device, for example. In another particular embodiment, which will be described in detail below, a double pre-metal dielectric process may be applied to an array region and a circuitry region, wherein each such region may include substantially different materials. Accordingly, an array region and a circuitry region may each involve different lithography processes, such as an etching process. In one implementation, an array region may be masked while such lithography processes are applied to a neighboring circuitry region. Thereafter, the circuitry region may be masked while lithography processes are applied to the array region, for example.

Figure 1:
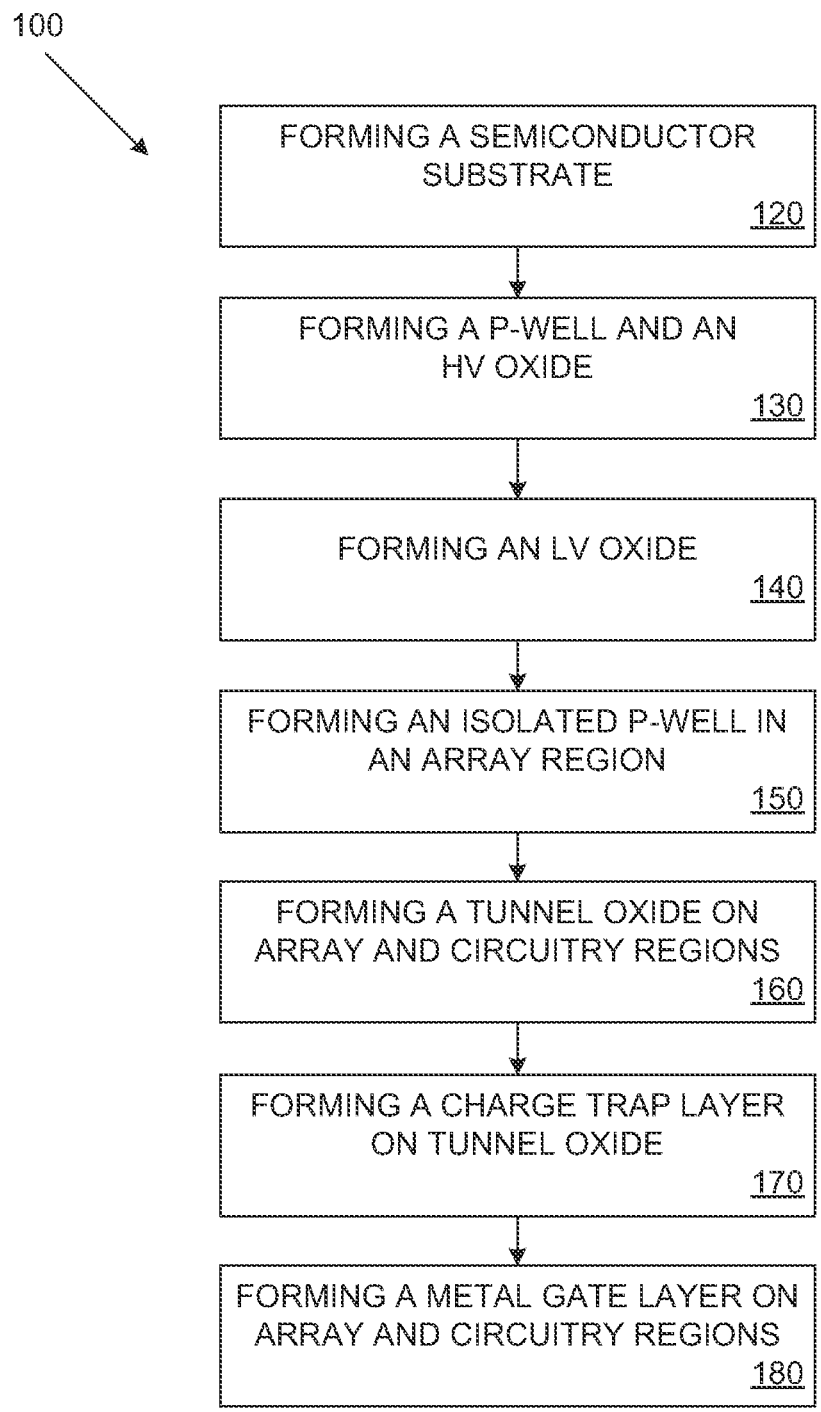
FIG. 1 is a flow diagram of a process to fabricate a charge trap NAND flash memory device, according to an embodiment.
Figure 2:
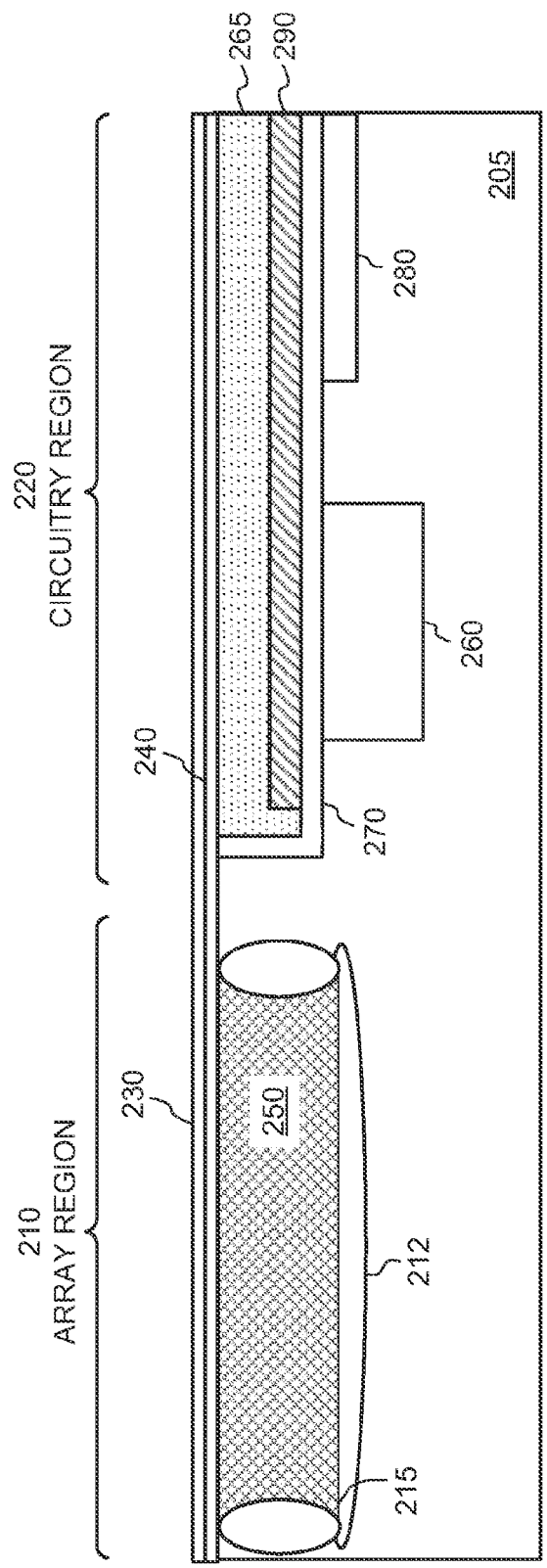
FIG. 2 is a cross-sectional view of a semiconductor structure including an array region and a circuitry region, according to an embodiment.

FIG. 1 is a flow diagram of a process 100 to fabricate a charge trap NAND flash memory device, according to an embodiment. FIG. 2 is a cross-sectional view of a semiconductor structure including an array region and a circuitry region, also according to an embodiment. At block 120, a semiconductor substrate is formed. Referring to FIG. 2, in a particular embodiment such a substrate may comprise substrate 205 including an array region 210 and a periphery circuitry region 220. Substrate 205 may include a recession so that circuitry region 220 can be formed lower than array region 210. Such a difference in height between array region 210 and circuitry region 220 may be useful to avoid problems associated with using a chemical mechanical polishing (CMP) process, for example. Such problems may include planarization by-products such as residual materials resulting from CMP process steps. Referring again to FIG. 1, at block 130, a p-well 260 may be formed in circuitry region 220 of semiconductor substrate 205. At block 140, a low voltage (LV) oxide 270 and high voltage (HV) oxide 280 may be formed from an oxide layer in circuitry region 220. In a particular embodiment, LV oxide 270 may be formed by growing an oxide layer, whereas HV oxide 280 may be formed by selective oxidation, for example. Also, LV oxide 270 may be formed on p-well 260, whereas HV oxide 280 may be formed adjacent to p-well 260. A polysilicon layer 290 may be deposited on both array region 210 and circuitry region 220 to cover LV oxide 270 and HV oxide 280. In another particular embodiment, LV oxide may be formed where LV circuitry is needed, such as on an n-well or a p-well, for example, whereas HV oxide maybe be formed in all HV regions, such as on an n-well or a p-well). A high temperature oxide (HTO) and/or PECVD oxide 265 may be formed over polysilicon layer 290. Referring to FIG. 1, at block 150, an isolated p-well 250 may be formed above a buried n-well implant 212. N-well implant walls 215 may also be formed adjacent to p-well 250. Polysilicon may be removed from array region 210 while remaining in circuitry region 220. Exposed LV oxide 270 in array region 210 may be cleaned using a wet etch (e.g., HF and/or a diluted buffered oxide etch (BOE)) until array region 210 and circuitry region 220 become substantially level. At block 160, a tunnel oxide 240 may be grown on array region 210 and on circuitry region 220, covering isolated p-well 250 and recessed circuitry. Next, at block 170, a charge trap layer 230 may be deposited on tunnel oxide 240.

Figure 3:
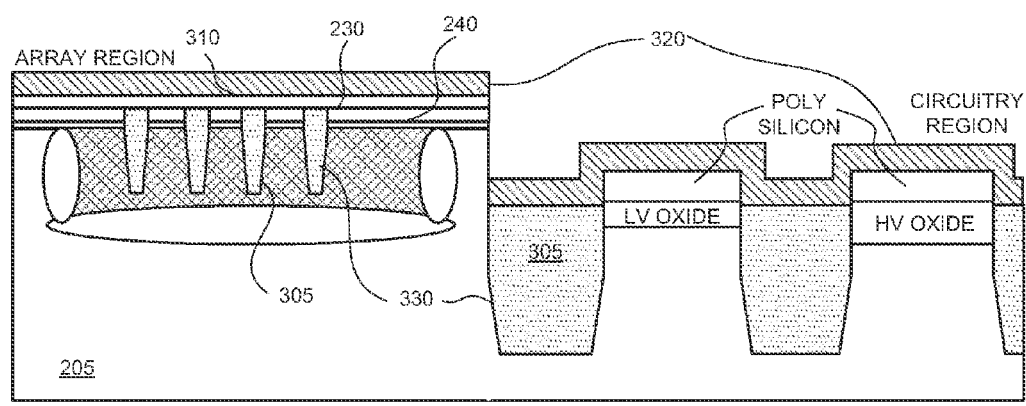
FIG. 3 is a cross-sectional view of a semiconductor structure including a charge trap layer and a metal gate, according to an embodiment.

FIG. 3 is a cross-sectional view of a semiconductor structure including a charge trap layer and a metal gate, such as those elements shown in the embodiment of FIG. 2. An insulating material 305 may be used to fill trenches 330 formed in array region 210 and circuitry region 220. Such an insulating material may include silicon dioxide, for example. Next, excess insulating material 305 may be planarized to form shallow trench isolation (STI) structures. In a particular embodiment, further processes may include a sidewall oxidation, filling, and CMP, for example. In a particular implementation, a filling process may include a high density plasma (HDP) deposition and/or a spin-on dielectric (SOD) process. A wet etch, or des ox, process may be performed to remove any excess oxide material in order to form a desirable profile for a high-k layer deposition on charge trap layer 230 in both array region 210 and circuitry region 220. In a particular implementation, such a high-k layer deposition may be removed from circuitry region 220, leaving a high-k layer 310.

Referring to FIGS. 1 and 3, at block 180, a metal gate layer 320 may be deposited on high-k layer 310 in array region 210 and on polysilicon layer 290 in circuitry region 220. In a particular embodiment, metal gate layer 320 may be common for both array region 210 and circuitry region 220. In other words, the same metal layer may be used to metalize both the array region and the peripheral transistors (FIG. 4A) in the circuitry region, for example. Accordingly, in a particular example, the metal layer used to metalize the array region and the metal layer to metalize the peripheral transistors in the circuitry region may both comprise the same material composition. Such a common metal gate layer may be used for a local interconnection between array region 210 and circuitry region 220, for example. In a particular embodiment, metal gate layer 320 may be used as an electrical connection between word lines and array/circuitry region 210/220. In another particular embodiment, metal gate layer 320 may be used as an electrical connection between a source connection and array/circuitry region 210/220. Of course, such electrical connections are merely examples, and claimed subject matter is not so limited.

In an embodiment, the semiconductor structure shown in FIG. 3 may be further treated using a NAND-one-gate-mask process flow, wherein both array region 210 and circuitry region 220 are treated at the same time by single mask processes. In another embodiment, the semiconductor structure shown in FIG. 3 may be further treated in a process flow performed for one region before the other region. For example, a process flow may be performed for array region 210 after performing a separate process flow for circuitry region 220. Such a process flow may include lithographic processes, such as masking and etching processes, for example.

Figure 4B:
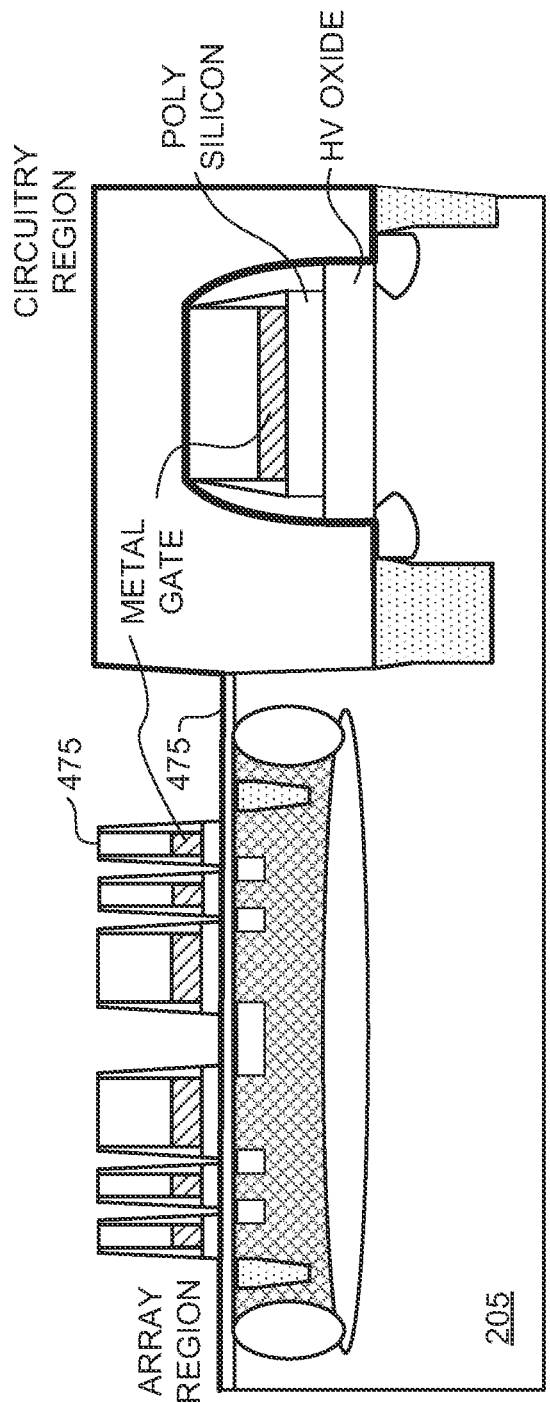
FIG. 4B is a cross-sectional view of a semiconductor structure along a bitline of an array region, according to an embodiment.

A flow process wherein a circuitry region is developed before an array region will now be described with reference to FIGS. 4A and 4B. FIG. 4A is a cross-sectional view of a semiconductor structure along a wordline of an array region and FIG. 4B is a cross-sectional view of a semiconductor structure along a bitline of an array region, according to an embodiment. An oxide hard mask (not shown) may be formed on an array region, such as array region 210 shown in FIG. 2 for example, to protect the array region during subsequent processing of a circuitry region, such as circuitry region 220 shown in FIG. 2. Such a hard mask may also be formed on a metal gate layer in circuitry region 220, though portions, such a local interconnections may be exposed and/or covered only by an etching mask. In this fashion, array region 210 may be protected while local interconnections and portions of the circuitry region, including periphery gates for example, may be patterned. Lightly doped drain (LDD) junctions 450 may be formed for both LV transistors (not shown) and HV transistors 430 in circuitry region 220 by masked ion implantation. In a particular embodiment, spacers 460 in conjunction with selective masking may be used to form such LDD junctions. Using a similar masking process, n+ and p+ junctions may be formed in circuitry region 220. Meanwhile, the hard mask protecting array region 210 may be formed thick enough to avoid ion contamination in the array region while performing ion implantation in circuitry region 220.

In a subsequent process, a conformal borderless nitride 465 may be formed. Next, a dielectric layer 470, such as silicon oxide and/or a low-k material, may be formed. Next, a CMP process may be performed on layer 470 until layer 470 is level with exposed portions of nitride 465. That is, layer 470 may be completely removed from the array region.

In an embodiment, patterning of array gates and cell definition may now be performed in array region 210. In a particular embodiment, an array gate etch may be performed in array region 210, allowing LDD and source/drain implantations without altering circuitry region 220.

FIG. 5 is a cross-sectional view of a semiconductor structure showing a dielectric layer 570, such as silicon oxide and/or a low-k material, formed adjacent to cells in array region 210, according to an embodiment. A CMP process may be performed on layer 570 until layer 570 is substantially level with exposed portions of nitride 475. In a particular embodiment, a process subsequent to process 100 shown in FIG. 1 may conclude by forming various contacts, including a dual damascene back end process.

While there has been illustrated and described what are presently considered to be example embodiments, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

What is claimed is:

1. An integrated circuit device, comprising:
   trenches filled with an insulator, the trenches defining active regions for an array region and a circuitry region, wherein the circuitry region is recessed relative to the array region and comprises a plurality of the trenches;
   low voltage insulator extending over the active regions and between some of the trenches, and high voltage insulator extending over the active regions and between others of the trenches;
   polysilicon overlying the low voltage insulator and the high voltage insulator, and defining recesses directly over the trenches filled with insulator;
   one or more wells in the recessed circuitry region;
   an isolated p-well in the array region;
   a tunnel oxide on the array region covering the isolated p-well and not covering the circuitry region; and
   a metal gate layer in the circuitry region, the metal gate layer extending into the recesses defined by the polysilicon, the metal gate layer further disposed in the array region.

2. The device of claim 1, wherein the low voltage insulator is a low voltage oxide and the high voltage insulator is a high voltage oxide, wherein at least some of the one or more wells includes both the low voltage (LV) oxide and the high voltage (HV) oxide.

3. The device of claim 1, further comprising:
   a first pre-metal dielectric disposed in the array region; and a second pre-metal dielectric disposed in the circuitry region.

4. An integrated circuit device, comprising:
   a substrate, comprising:
      an array region;
      a circuitry region, wherein the circuitry region includes a silicon region recessed relative to the array region;
      a plurality of trenches in each of the array region and the recessed silicon region, the trenches filled with dielectric material;
      low voltage (LV) oxide extending between some of the trenches, and high voltage (HV) oxide extending between others of the trenches; and
      polysilicon overlying the low voltage oxide and the high voltage oxide, and defining recesses directly over the trenches filled with insulator;
   an isolated doped well in the array region;
   a tunnel oxide layer covering the isolated doped well in the array region; and
   a metal gate layer in the circuitry region, the metal gate layer extending into the recesses defined by the polysilicon, the metal gate layer further disposed in the array region.

5. The device of claim 4, wherein the trenches and dielectric material constitute shallow trench isolation (STI) structures.

6. The device of claim 5, wherein the LV oxide is thinner than the HV oxide.

7. The device of claim 4, further comprising a charge trap layer on the tunnel oxide.

8. The device of claim 7, further comprising a dielectric layer on the charge trap layer.

9. A charge trapping memory device, comprising:
   a memory cell array region formed in an electrically isolated well of a substrate, the memory cell array region comprising:
      a tunnel oxide; and
      a charge trapping material formed over the tunnel oxide; and
   a circuit region formed in a recess of the substrate separate from the memory cell array region, the circuit region comprising:
      low voltage transistors having a first gate oxide with a first thickness;
      high voltage transistors having a second gate oxide with a second thickness greater than the first thickness;
      polysilicon overlying the first gate oxide and the second gate oxide, and defining recesses between individual ones of the first and second gate oxides; and
      a metal gate layer in the circuitry region, the metal gate layer extending into the recesses defined by the polysilicon, the metal gate layer further disposed in the array region.

10. The device of claim 9, wherein the tunnel oxide has different characteristics from the first and second gate oxides.

11. The device of claim 10, wherein the first gate oxide and the second gate oxide are formed prior to the tunnel oxide.

* * * * *